United States Patent
Giesen et al.

(10) Patent No.: US 9,985,157 B2
(45) Date of Patent: May 29, 2018

(54) OPTICAL ENERGY TRANSMISSION SYSTEM

(71) Applicant: Deutsches Zentrum fuer Luft— und Raumfahrt e.V., Cologne (DE)

(72) Inventors: Adolf Giesen, Aichtal (DE); Stephan Anders, Holzkirchen (DE); Hans-Albert Eckel, Heimsheim (DE)

(73) Assignee: Deutsches Zentrum fuer Luft— und Raumfahrt e.V., Cologne (DE)

( * ) Notice: Subject to any disclaimer, the term of this patent is extended or adjusted under 35 U.S.C. 154(b) by 421 days.

(21) Appl. No.: 14/723,602

(22) Filed: May 28, 2015

(65) Prior Publication Data
US 2016/0005907 A1    Jan. 7, 2016

Related U.S. Application Data

(63) Continuation of application No. PCT/EP2013/075636, filed on Dec. 5, 2013.

(30) Foreign Application Priority Data

Dec. 7, 2012  (DE) .......... 10 2012 111 978

(51) Int. Cl.
*H02J 50/30*    (2016.01)
*H01L 31/054*   (2014.01)
(Continued)

(52) U.S. Cl.
CPC .......... *H01L 31/0547* (2014.12); *G02B 5/003* (2013.01); *G02B 27/145* (2013.01);
(Continued)

(58) Field of Classification Search
CPC .............................. H02J 50/30; H04B 10/807
See application file for complete search history.

(56) References Cited

U.S. PATENT DOCUMENTS 4,976,789 A * 12/1990 Holloman ............ G02B 6/4204
                                                    136/246
5,386,427 A    1/1995 Zayhowski
(Continued)

FOREIGN PATENT DOCUMENTS

EP    0 632 551    1/1995
EP    0 869 591    10/1998
(Continued)

OTHER PUBLICATIONS

"Corner reflector", Nov. 15, 2012, Wikipedia, retrieved via Internet Archive Wayback Machine at <https://web.archive.org/web/20121115095710/https://en.wikipedia.org/wiki/Corner_reflector> on Sep. 13, 2017.*

(Continued)

*Primary Examiner* — Rexford Barnie
*Assistant Examiner* — David Shiao
(74) *Attorney, Agent, or Firm* — Lipsitz & McAllister, LLC

(57) ABSTRACT

An optical energy transmission system having an energy-emitting unit is provided. The energy-emitting unit has a laser radiation source for generating an energy-transmitting laser beam and an aiming device for aligning the energy-transmitting laser beam relative to an energy-receiving unit which includes an optical/electrical converter, which converts the energy of the energy-transmitting laser beam into electrical energy. The converter has at least one converter element having a plurality of surfaces which reflect the energy-transmitting laser beam and which are arranged relative to one another such that the impinging energy-transmitting laser beam is deflected by one of the reflective surfaces to another one of the reflective surfaces. At least some of the reflective surfaces are formed by a conversion unit which reflects one part of the impinging laser beam and (Continued)

absorbs the other part thereof in a photovoltaic element, and in the process converts the optical energy into electrical energy.

14 Claims, 11 Drawing Sheets

(51) Int. Cl.
*H02J 50/90* (2016.01)
*G02B 5/00* (2006.01)
*G02B 27/14* (2006.01)
*H04B 10/80* (2013.01)
*H02J 17/00* (2006.01)
*H01L 31/056* (2014.01)

(52) U.S. Cl.
CPC ............ *H01L 31/056* (2014.12); *H02J 17/00* (2013.01); *H02J 50/30* (2016.02); *H02J 50/90* (2016.02); *H04B 10/807* (2013.01); *Y02E 10/52* (2013.01)

(56) References Cited

U.S. PATENT DOCUMENTS

| | | | |
|---|---|---|---|
| 5,553,088 | A | 9/1996 | Brauch et al. |
| 6,689,949 | B2 * | 2/2004 | Ortabasi ............... H01L 31/052 |
| | | | 136/244 |
| 7,415,057 | B2 | 8/2008 | Hall |
| 7,711,025 | B2 | 5/2010 | Schmitz et al. |
| 7,773,658 | B2 | 8/2010 | Hall |
| 7,826,513 | B2 | 11/2010 | Bossert et al. |
| 7,970,039 | B2 | 6/2011 | Mason et al. |
| 8,165,182 | B2 | 4/2012 | Giesen et al. |
| 8,599,896 | B2 | 12/2013 | Giesen et al. |
| 2002/0172253 | A1 | 11/2002 | Vetrovec |
| 2004/0227057 | A1 * | 11/2004 | Tuominen ............ H04B 10/807 |
| | | | 250/205 |
| 2005/0195881 | A1 | 9/2005 | Hall |
| 2006/0140241 | A1 | 6/2006 | Schmitz et al. |
| 2007/0280325 | A1 | 12/2007 | Wang |
| 2008/0037597 | A1 | 2/2008 | Mason et al. |
| 2008/0130124 | A1 * | 6/2008 | Graham .................... H02J 5/00 |
| | | | 359/614 |
| 2008/0298423 | A1 | 12/2008 | Hall |
| 2009/0059974 | A1 | 3/2009 | Wang et al. |
| 2009/0059991 | A1 | 3/2009 | Bossert et al. |
| 2009/0268775 | A1 | 10/2009 | Holmes |
| 2009/0272424 | A1 * | 11/2009 | Ortabasi ............. H01L 31/0543 |
| | | | 136/246 |
| 2010/0012819 | A1 * | 1/2010 | Graham .................... H02J 5/00 |
| | | | 250/205 |
| 2010/0027572 | A1 | 2/2010 | Widen et al. |
| 2010/0065110 | A1 * | 3/2010 | Birdwell ............... H01L 31/042 |
| | | | 136/252 |
| 2012/0269517 | A1 | 10/2012 | Rastegar |

FOREIGN PATENT DOCUMENTS

| | | |
|---|---|---|
| EP | 0 869 592 | 10/1998 |
| EP | 1 453 157 | 9/2004 |
| EP | 1 469 619 | 10/2004 |
| EP | 1 566 866 | 8/2005 |
| EP | 1 677 394 | 7/2006 |
| EP | 2 031 712 | 3/2009 |
| FR | 2 786 938 | 6/2000 |
| JP | 2000-350387 | 12/2000 |
| WO | WO 2005/083851 | 9/2005 |
| WO | WO 2012/096966 | 7/2012 |

OTHER PUBLICATIONS

Voss, A. et al., "Intra-Cavity Beam Shaping for High Power Thin-Disk Lasers", Proceedings of the International Society for Optical Engineering (SPIE), SPIE, USA vol. 6346, Apr. 26, 2007, 12 pages.

Mende, J. et al., "Concept of Neutral Gain Modules for Power Scaling of Thin-Disk Lasers", Applied Physics B; Lasers and Optics, Springer, Berlin, Germany, vol. 97, No. 2, Sep. 12, 2009, pp. 307-315.

Mende, J. et al., "Thin Disk Laser: Power Scaling to the kW Regime in Fundamental Mode Operation", Proceedings of the International Society for Optical Engineering (SPIE), SPIE, USA, vol. 7193, Jan. 25, 2009, 12 pages.

Hunt, J. T. et al., "Suppression of Self-Focusing Through Low-Pass Spatial Filtering and Relay Imaging", Applied Optics USA, vol. 17, No. 13, Jul. 1, 1978, pp. 2053-2057.

W. Koechner, "Solid-State Laser Engineering", Springer-Verlag New York Heidelberg Berlin 1976, pp. 197-198.

Pavel, N., et al., "Positive-Branch Unstable Resonators With Thermal Lens Compensation", Optics and Laser Technology, Elsevier Science Ltd., vol. 28 No. 6, 1996, pp. 451-455.

\* cited by examiner

OPTICAL ENERGY TRANSMISSION SYSTEM

This application is a continuation of international application number PCT/EP2013/075636 filed on Dec. 5, 2013 and claims the benefit of German application No. 10 2012 111 978.3 filed on Dec. 7, 2012, the teachings and disclosure of which are hereby incorporated herein by reference in their entirety and for all purposes.

BACKGROUND OF THE INVENTION

The invention relates to an optical energy transmission system, comprising an energy-emitting unit which has a laser radiation source for generating an energy-transmitting laser beam and an aiming device for aligning the energy-transmitting laser beam relative to an energy-receiving unit which is comprised by the energy transmission system and which comprises an optical/electrical converter that converts the energy of the energy-transmitting laser beam directly into electrical energy.

Such energy transmission systems are known in principle from the prior art, the known converter being composed of a photovoltaic element which converts the optical energy of the energy-transmitting laser beam directly into electrical energy.

On the one hand, this results in problems to the effect that the thermal destruction threshold of the photovoltaic element must not be exceeded and, on the other hand, to the effect that in particular when the energy-transmitting laser beam is reflected, laser safety is not permanently ensured.

SUMMARY OF THE INVENTION

It is therefore an object of the invention to improve an optical energy transmission system of the generic kind in such a manner that, on the one hand, despite high optical power, the thermal destruction thresholds of the photovoltaic elements used are not reached and, on the other hand, laser safety is ensured. This object is achieved according to the invention for an optical energy transmission system of the aforementioned kind in that the converter has at least one converter element having a plurality of surfaces which reflect the energy-transmitting laser beam impinging on said converter element and which are arranged relative to one another such that the impinging energy-transmitting laser beam is deflected by one of the reflective surfaces to another one of the reflective surfaces, and that at least some of the reflective surfaces are formed in each case by a conversion unit which reflects one part of the impinging laser beam and absorbs the other part thereof in a photovoltaic element which is comprised by the conversion unit, and in the process converts the optical energy directly into electrical energy.

The advantage of the solution according to the invention is, on the one hand, that laser safety can be ensured by using a plurality of reflective surfaces and, on the other hand, that some, that is, at least two, of the reflective surfaces are formed in each case by one conversion unit, which reflect part of the impinging laser beam, but convert another part directly into electrical energy. As a result, there is the possibility to convert the energy of the impinging laser beam directly into electrical energy by means of a plurality of photovoltaic elements and thus, despite high energy of the energy-transmitting laser beam, the destruction threshold of the individual photovoltaic elements is not reached.

It has proved to be particularly advantageous if at least three of the reflective surfaces of the converter are formed by a conversion unit.

In order to be able to also operate with high energy in the energy-transmitting laser beam, it has proved to be advantageous if the converter has at least one converter element, the reflective surfaces of which are formed by more than three, preferably more than five, conversion units.

No detailed information has been provided heretofore with respect to the formation of the conversion units.

In the case of non-perpendicular incidence of a laser beam, a conversion unit formed by only one photovoltaic element in principle has a reflectance different from zero and an absorptance different from zero.

However, in order to be able to adapt the reflectance and the absorptance, it is preferably provided that the respective conversion unit comprises the photovoltaic element and a reflection-determining coating disposed on a radiation entrance surface of the photovoltaic element.

By means of such a reflection-determining coating, the reflectance and the absorptance of each conversion unit can be specified in a defined manner and optionally individually.

Regardless of the respective reflection-determining coating, the reflectance and the absorptance can be a function of the incident angle of the energy-transmitting laser beam on the reflection-determining coating, so that in this case it can optionally be necessary to align the respective reflective surface and the energy-transmitting laser beam relative to one another in such a manner that a certain angular range for the incident angle is met.

For example, in one solution according to the invention, it is provided that the converter is formed such that the energy-transmitting laser beam impinges on the first reflective surface at an incident angle that is 80° or less; the incident angle is preferably selected such that the incident angle is 60° or less.

Furthermore, a minimum value of the incident angle is also advantageous.

For this reason, it is provided in an advantageous embodiment that the converter is formed such that the energy-transmitting laser beam impinges on the first reflective surface at an incident angle that is 10° or more, preferably 30° or more.

No detailed information has been provided heretofore with respect to the reflectance and the absorptance of the conversion units of a converter.

Thus, a particularly simple solution provides that all conversion units of a converter element have the same reflectance and absorptance.

However, as an alternative in the case of more than two or three conversion units, it is advantageous if the conversion units successively acted on by the laser beam have different reflectances and absorptances.

Such a different reflectance and absorptance can be set in such a manner that, on the one hand, the thermal destruction threshold of the respective photovoltaic element is not reached and that, on the other hand, a largely complete absorption of the energy-transmitting laser beam can be achieved with as few conversion elements as possible.

This objective can preferably be achieved in that in the case of the conversion units successively acted on by the energy-transmitting laser beam, the reflectance decreases and the absorptance increases in the order in which they are acted on by the energy-transmitting laser beam.

Assuming that after a number of N reflections at conversion units according to the invention, the energy of the energy-transmitting laser beam is almost zero after the last reflection, then the absorptance of successive conversion units is to be selected according to the following series:

$1/n, 1/(n-1), 1/(n-2), \ldots, \frac{1}{2}, 1$.

The reflectances corresponding to the absorptances are to be selected according to the following series:

$(n-1)/n, ((n-1)-1)/(n-1), ((n-1)-2)/(n-2) \ldots 0$

This series of absorptances can be further generalized in the following series for the absorptance:

$1/(n+m), 1/(n-1+m), 1/(n-2+m), \ldots 1/(1+m)$ and the following series for the reflectance:

$((n+m-1))/(n+m), ((n+m-1)-1)/(n-1+m), ((n+m-1)-2)/(n-2+m) \ldots ((n+m-1)-(n-1))/(1+m)$.

In this case, the $m/(n+m)$th part of the incident energy or power is still reflected from the last reflective surface after the nth reflection. This part can now be directed into an optical sump, or there is the possibility to absorb this part completely in a photovoltaic element by perpendicularly impinging thereon, or to reflect this part back and then to absorb in the remaining conversion units upon return.

No detailed information has been provided heretofore with respect to the details of the structure of the converter element.

Thus, an advantageous solution provides that the reflective surfaces reflect the energy-transmitting laser beam in such a manner that the laser beam runs overall in two spatial directions in the converter element.

As an alternative, it is conceivable that the reflective surfaces reflect the energy-transmitting laser beam such that the laser beam runs overall in three spatial directions in the converter element.

No detailed information has been provided heretofore with respect to the alignment of the reflective surfaces in the converter element relative to the energy-transmitting laser beam.

In principle, any alignments whatsoever would be conceivable.

In order to obtain conditions as favorable as possible, it is preferably provided that the reflective surfaces of the converter element run at an angle in a range between 30° and 60°, preferably in the range between 40° and 50°, to the portion of the energy-transmitting laser beam impinging on these respective reflective surfaces.

Furthermore, an advantageous solution provides that the converter element is constructed such that after reflection of the energy-transmitting laser beam at a plurality of reflected surfaces, the converter element reflects the energy-transmitting laser beam back on itself.

This solution has the advantage that in this way, the requirements for laser safety can be met in a simple manner because it is ensured that a laser beam exiting the converter element again returns back to the energy-emitting unit and cannot be reflected in space in an uncontrolled manner.

A simple solution for implementing this provides that the converter element comprises a triple prism that reflects the laser beam back on itself.

As an alternative, another solution provides that after reflection of the energy-transmitting laser beam at a plurality of reflective surfaces, the converter element absorbs the energy-transmitting laser beam essentially completely by the last conversion unit. In this case, laser safety likewise is ensured in a simple manner.

With regard to the construction of the aiming device, no detailed information has been provided in connection with the exemplary embodiments heretofore explained.

Thus, an advantageous solution provides that the aiming device comprises an aiming control that controls the alignment of the energy-transmitting laser beam relative to the energy-receiving unit.

With this aiming control it is preferably ensured that laser safety is ensured, in particular that the energy-transmitting laser beam does not impinge on other objects that are not provided for energy transmission.

Furthermore, an advantageous exemplary embodiment provides that the aiming device has a target detection unit which comprises a position of an impingement area of the energy-receiving unit, which impingement area is provided for the energy-transmitting laser beam.

With such a target detection unit, it can be ensured that the laser beam always impinges on the impingement area of the energy-receiving unit and does not strike other objects.

A particularly advantageous solution provides that the aiming device detects impingement of the energy-transmitting laser beam on an impingement area of the energy-receiving unit and prevents the energy-transmitting laser beam from exiting the energy-emitting unit if the energy-transmitting laser beam does not impinge on the impingement area.

Further features and advantages of the invention are the subject matter of the following description and the illustrations of several exemplary embodiments in the drawings.

DETAILED DESCRIPTION OF THE INVENTION

Figure 1:
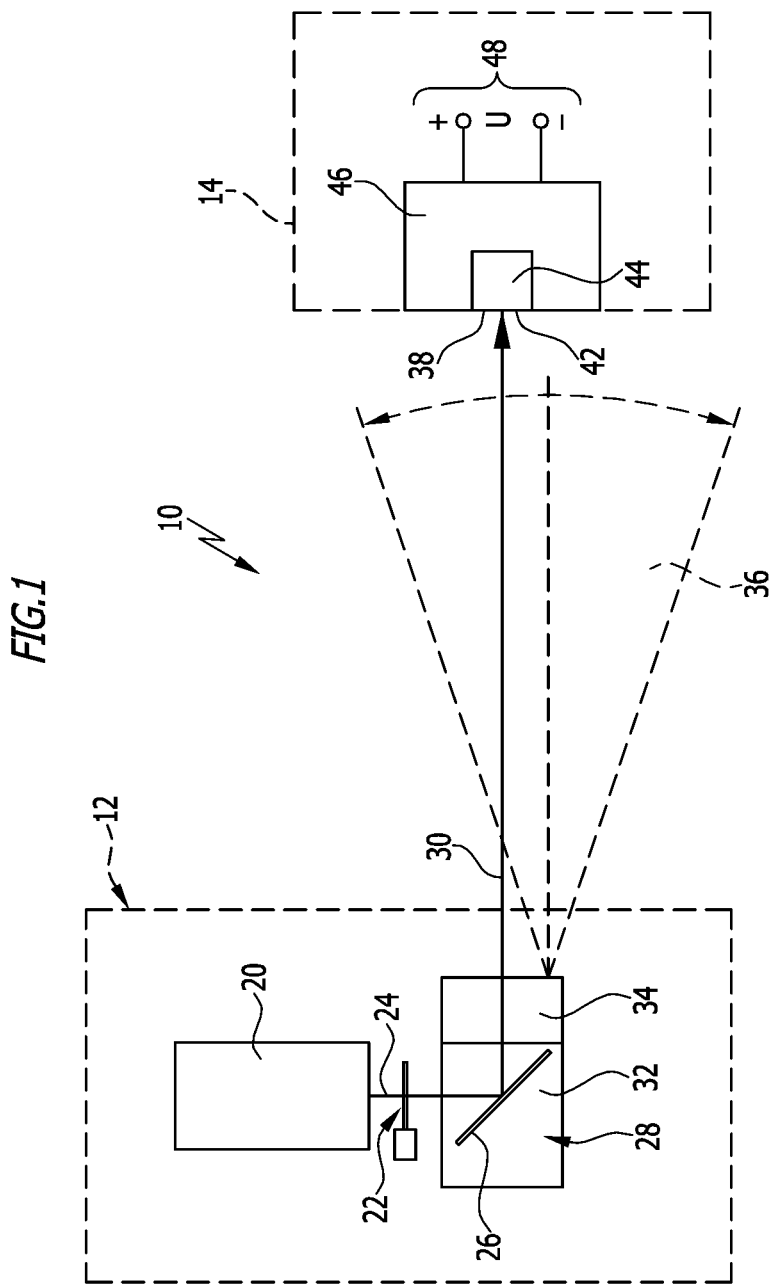
FIG. 1 shows a schematic illustration of an energy transmission system according to the invention.

An optical energy transmission system according to the invention, designated as a whole by reference numeral 10 in FIG. 1, comprises a unit, designated as a whole by reference numeral 12, which emits optical energy or optical power, and an energy-receiving unit, designated as a whole by reference numeral 14, which receives the optical energy or power.

The energy-emitting unit 12 itself comprises a high-energy laser radiation source 20 which has an exit aperture 22 and generates a laser beam 24, which, for example, is deflected by a deflection mirror 26 of an aiming device, designated as a whole by reference numeral 28, and propagates as an energy-transmitting laser beam 30 emanating from the energy-emitting unit 12 toward the energy-receiving unit 14.

However, for aligning the laser beam 30, it is also conceivable as an alternative to arrange the entire laser radiation source 20 or, for example in the case of a fiber laser, to arrange only a component of the laser radiation source 20, from which the laser beam 30 exits, in an alignable manner.

The aiming device 28 itself also comprises an aiming control 32 which controls the position of the deflection mirror 26 to allow the energy-transmitting laser beam 30 to impinge at the desired location on the energy-receiving unit 14.

For this purpose, the aiming control 32 preferably also comprises a target detection unit 34, which determines within a detection range 36 the position of the impingement area 38 of the energy-receiving unit 14 on which the energy-transmitting laser beam 30 is supposed to impinge.

For example, the target detection unit 34 operates either by means of optical scanning of the detection range 26 for identifying the impingement area 38, or by means of optical and/or electronic or electromagnetic scanning of the detection range 36, in order to exactly detect the position of the impingement area 38 within the detection range 36.

Subsequent to the exact detection of the position of the impingement area 38 relative to the energy-emitting unit 12, alignment of the energy-transmitting laser beam 30 in space via the aiming control 32 and by means of the deflection mirror 26, which is movable in all spatial directions, takes place in such a manner that the energy-transmitting laser beam 30 impinges within the impingement area 38 of the energy-receiving unit 14.

Furthermore, in a variant of the aiming device 28, the target detection unit 34 detects whether the energy-transmitting laser beam 30 actually impinges on the impingement area 38, for example by back reflection of the laser beam 30 from the impingement area 38 or by secondary emission of radiation, induced by the laser beam 30, from the impingement area 38.

If impinging of the energy-transmitting laser beam 30 on the impingement area 38 is detected with this variant of the aiming device 28, the aiming device 28 either closes the exit aperture 22 and/or switches off or misaligns the laser radiation source 20 so that the energy-transmitting laser beam 30 can no longer exit the energy-emitting unit 12.

In the energy-receiving unit 14, the impingement area 38 is formed by an inlet opening 42 of an optical/electrical converter 44 which converts the energy or power contained in the energy-transmitting laser beam 30 directly into electrical energy so that a voltage U is available at an electrical connection 48, either directly via the converter 44, or via a current/voltage converter unit 46.

The converter 44 can be designed in very many different ways.

Figure 2:
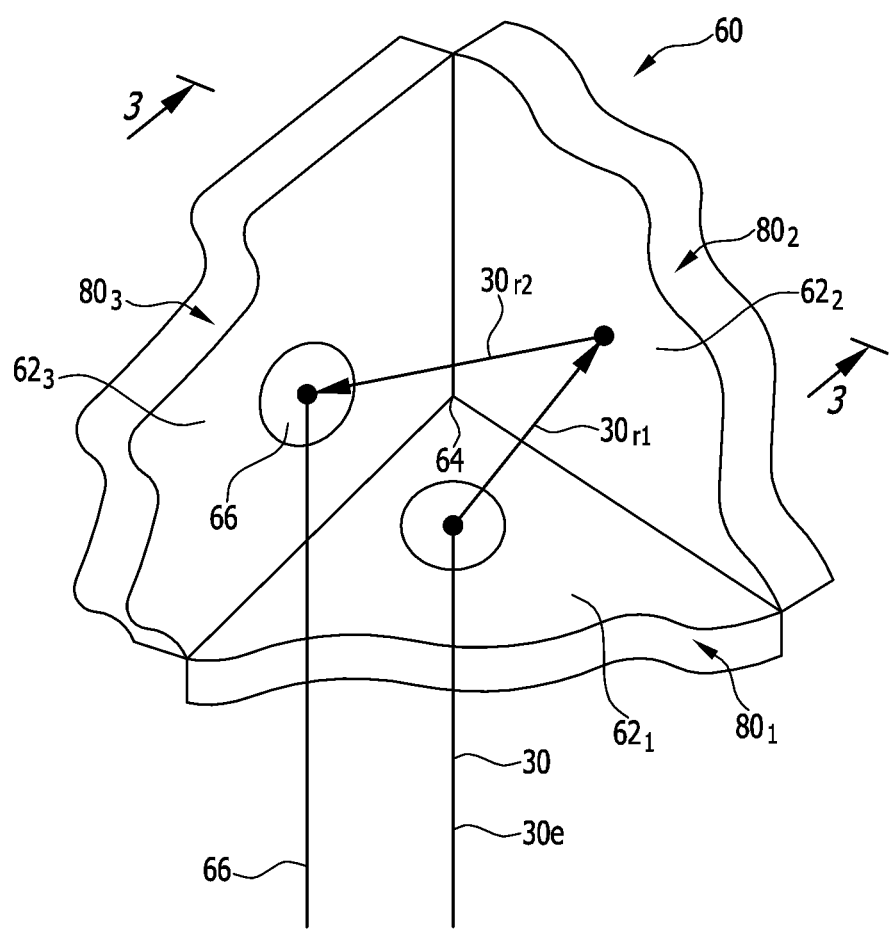
FIG. 2 shows a partial illustration of a converter of a first exemplary embodiment.

A first exemplary embodiment of a converter according to the invention, illustrated in FIG. 2, comprises as a converter element, a triple prism, designated as a whole by reference numeral 60, which is formed by three reflective surfaces $62_1$, $62_2$, and $62_3$ which extend toward one another in each case at an angle of 90° and intersect in a corner point 64.

By such a triple prism 60, the incident portion $30_e$ of the energy-transmitting laser beam 30, upon impinging on the reflective surface $62_1$, is initially reflected as a first reflected portion $30_{r1}$ onto the reflective surface $62_2$ and is reflected there by the latter as a second reflective portion $30_{r2}$ onto the reflective surface $62_3$ and then, after a three-dimensional course in the triple prism 60, exits the triple prism 60 again as an outgoing laser beam 66, the essential characteristic feature of the triple prism 60 being that the outgoing laser beam 66 runs parallel to the incident portion $30_e$ of the energy-transmitting laser beam 30, but in the opposite direction.

Figure 3:
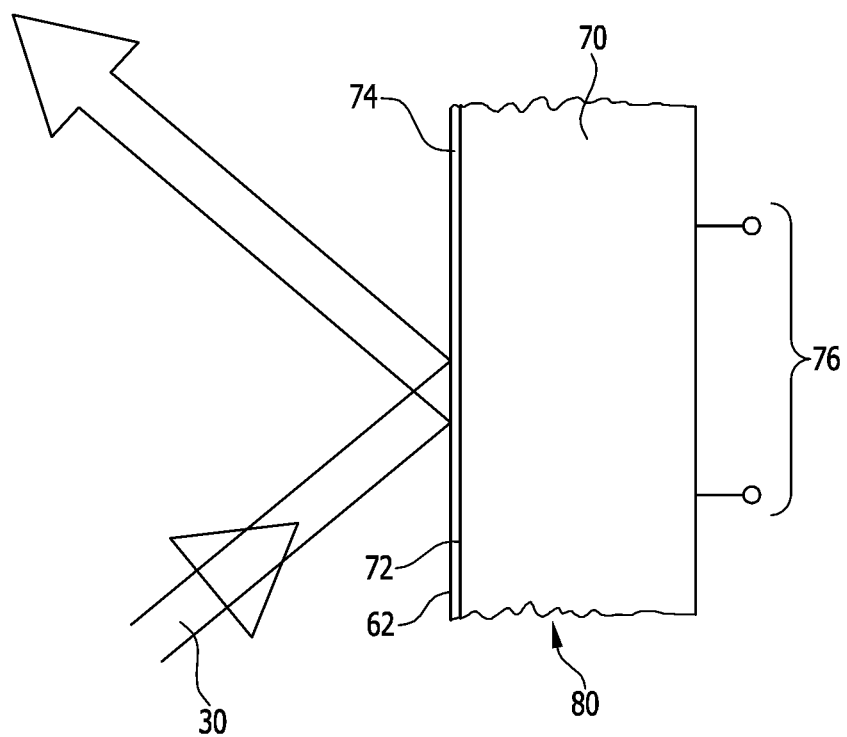
FIG. 3 shows a section along the line 3-3 in FIG. 2.
Figure 4:
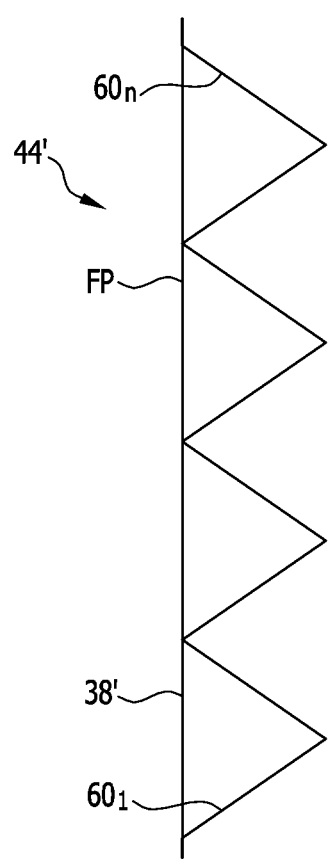
FIG. 4 shows a section through a second exemplary embodiment of a converter according to the invention.
Figure 5:
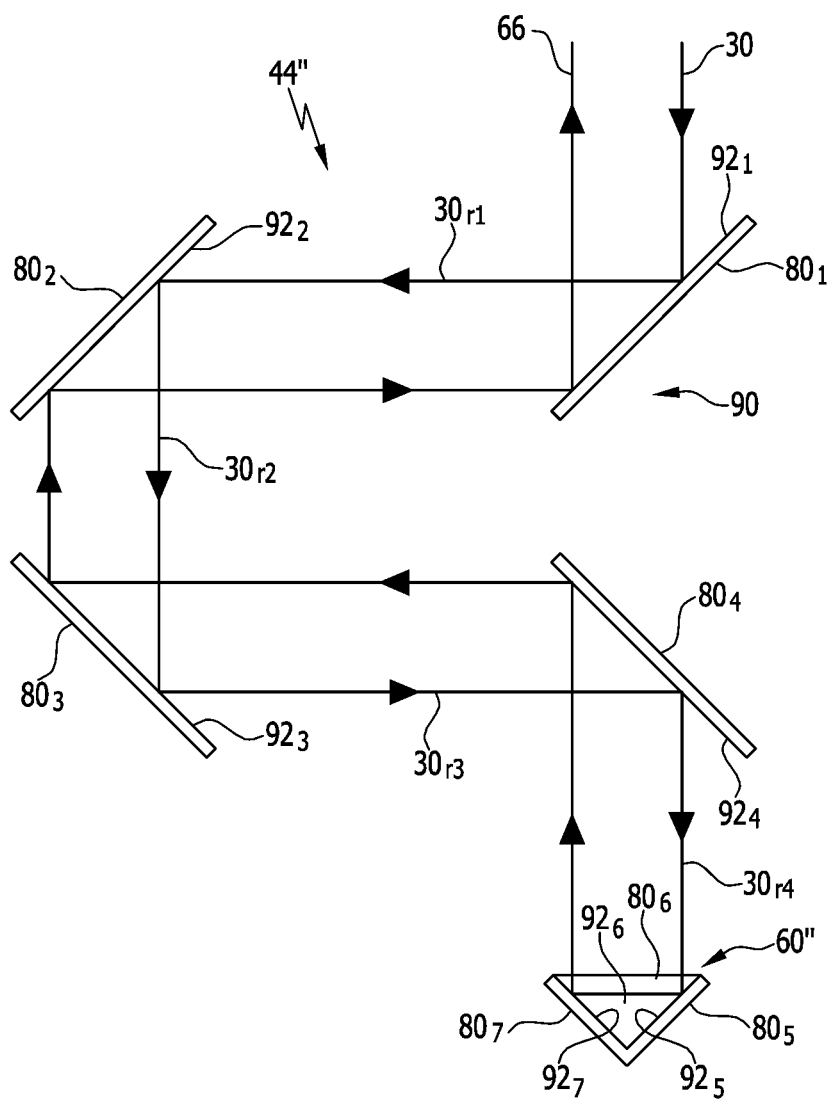
FIG. 5 shows a section through a third exemplary embodiment of a converter according to the invention.

As illustrated in FIG. 3, each of the reflective surfaces 62 of the triple prism 60 is formed by a photovoltaic element 70, the incident-radiation surface 72 of which either directly forms the reflective surface 62 or is additionally provided with a coating 74 which forms the reflective surface 62.

The reflective surface 62 is not a completely reflective surface, but, rather, is a partially reflective surface, so that part of the energy or power of the energy-transmitting laser beam 30 is absorbed by the photovoltaic element 70 and generates current therein which can flow via electrical connections 76 of the photovoltaic element 70.

The photovoltaic element 70 with its incident-radiation surface 72 and the coating 74, which optionally also determines the reflection, thus forms a conversion unit 80 for the energy-transmitting laser beam 30, which absorbs a significant part of the energy of the impinging energy-transmitting laser beam 30 and converts it directly into electrical energy.

For example, if half of the energy of the impinging laser beam 30 is absorbed by the conversion unit 80 and the other half is reflected, then the first reflected portion $30_{r1}$ of the energy-transmitting laser beam 30 impinges on the reflective surface $62_2$ with an energy that is reduced by half.

If the reflective surface $62_2$ is formed by a conversion unit $80_2$ that is formed in the same way as the conversion unit $80_1$ and has the same reflectance, then again, half of the energy of the first reflected portion $30_{r1}$ of the energy-transmitting laser beam 30 is absorbed and the other half is reflected, so that again the second reflected portion $30_{r2}$ of the energy-transmitting laser beam 30 has an energy that is only a quarter of the energy that the incident portion $30_e$ of the energy-transmitting laser beam 30 initially had prior to impinging on the converter 44.

If the reflective surface $62_3$ is also formed by a conversion unit $80_3$, which is constructed in the same manner as the reflective unit $80_1$, then again, half of the energy of the second reflected portion $30_{r2}$ of the energy-transmitting laser beam 30 is absorbed and the other half is reflected, so that the outgoing portion 66 of the energy-transmitting laser beam 30 still has one-eighth of the energy of the incident portion $30_e$ of the energy-transmitting laser beam 30.

However, if the reflectance of the reflective conversion units $80_1$ to $80_3$ is reduced, for example to a third, then the energy of the outgoing laser beam 66 is also reduced in relation to the incident portion $30_e$ of the energy-transmitting laser beam 30.

In the first exemplary embodiment of the converter 44 according to the invention having reflection surfaces 62 arranged corresponding to the triple prism 60, there is also the possibility to align the energy-transmitting laser beam 30 such that the center axis of this beam impinges exactly at the corner point 64, so that in this case the conditions are the same, but each of the reflective surfaces is acted on directly by a part of the incident portion $30_e$ of the energy-transmitting laser beam 30, and this part, in turn, is reflected on the further reflective surfaces 62, so that after triple reflection, each part of the energy-transmitting laser beam 30 propagates again as an outgoing portion 66 of the laser beam 30 parallel to the incident portion $30_e$ of the energy-transmitting laser beam 30.

In the first exemplary embodiment according to FIGS. 2 and 3, the impingement area 38 is defined by the inlet opening 42 of a single triple prism 60, so that exact alignment of the energy-transmitting laser beam 30 relative to the energy-receiving unit 14 has to be carried out by the target detection unit 34 and the aiming control 32.

However, in order to keep the requirements for the aiming control 32 lower, there is also the possibility to enlarge the impingement area 38 its being formed by a plurality of inlet openings $42_1$ to $42_n$ of triple prisms $60_1$ to $60_n$, all of which are arranged directly adjacent to one another in two dimensions on a surface FP and with the same alignment relative to this surface, so that, regardless of which of the triple prisms $60_1$ to $60_n$ serving as converter elements is acted on by the energy-transmitting laser beam 30, there is always the possibility to convert the energy of the energy-transmitting laser beam 30 with the same efficiency.

The second exemplary embodiment of the converter 44' according to the invention can be used, for example, when a large-area converter 44' having a correspondingly large impingement area 38' is to be provided in order to make sure that the requirements for the aiming control 32 and the target detection unit 34 do not become unnecessarily high, for example.

In a third exemplary embodiment of a converter 44" according to the invention, an arrangement of conversion units 80 is provided in a converter element wherein, for example, the incident portion $30_e$ of the energy-transmitting laser beam 30 impinges on a first reflective surface $92_1$, then impinges, in the form of a first reflected portion $30_{r1}$, on a second reflective surface $92_2$, then impinges, in the form of a second reflected portion $30_{r2}$, on a third reflective surface $92_3$, finally impinges, in the form of a third reflective portion $30_{r3}$, on a fourth reflective surface $92_4$, all these surfaces being, for example, flat reflective surfaces, and lastly impinges, in the form of a fourth reflected portion $30_{r4}$, on a triple prism 60" which has the reflective surfaces $92_5$, $92_6$ and $92_7$.

All reflective surfaces $92_1$ to $92_7$ are assigned conversion units $80_1$ to $80_7$ like the ones explained in connection with the first exemplary embodiment.

The triple prism 60" causes the laser beam 30, which overall has been reflected multiple times prior to impinging on the triple prism 60", to be reflected back to the reflective surfaces $92_4$, $92_3$, $92_2$ and $92_1$ by this triple prism 60" and then to leave the converter 44" again as an outgoing portion 66; however, the laser beam leaves with energy that is significantly less than the energy of the incident energy-transmitting laser beam 30.

However, in the third exemplary embodiment, it is also possible for a conversion unit 80 to perform the direct conversion of optical energy into electrical energy only with some and not with all reflective surfaces $92_1$ to $92_4$, using a photovoltaic element 70, and in cases in which reflection is required for beam deflection, to configure one or more of the reflective surfaces 92 as fully reflective surfaces.

In order to reduce the energy of the energy-transmitting laser beam 30 to the greatest possible extent before it impinges on the triple prism 60", the transmissions and reflections of the coatings 74 of the individual conversion units 80 can vary.

For example, in the case of the conversion unit $80_1$, the reflection can be set in such a manner that a fifth of the energy of the incident portion $30_e$ of the energy-transmitting laser beam 30 is absorbed, and in the conversion unit $80_2$, the reflection can be set in such a manner that a fourth of the energy of the reflected portion $30_{r1}$ is absorbed, in the conversion unit $80_3$, the coating 74 can be set in such a manner that a third of the energy of the reflected portion $30_{r2}$ is absorbed, in the conversion unit $80_4$, the coating 74 can be set in such a manner that half of the energy of the reflected portion $30_{r3}$ is absorbed, and in all conversion units $80_5$ to $80_7$, the coating 74 can be formed in such a manner that the entire residual energy in the reflected portion $30_{r4}$ is absorbed by the conversion units $80_5$ to $80_7$, so that the laser beam 30 returning from the triple prism 60" essentially has no more energy.

Figure 6:
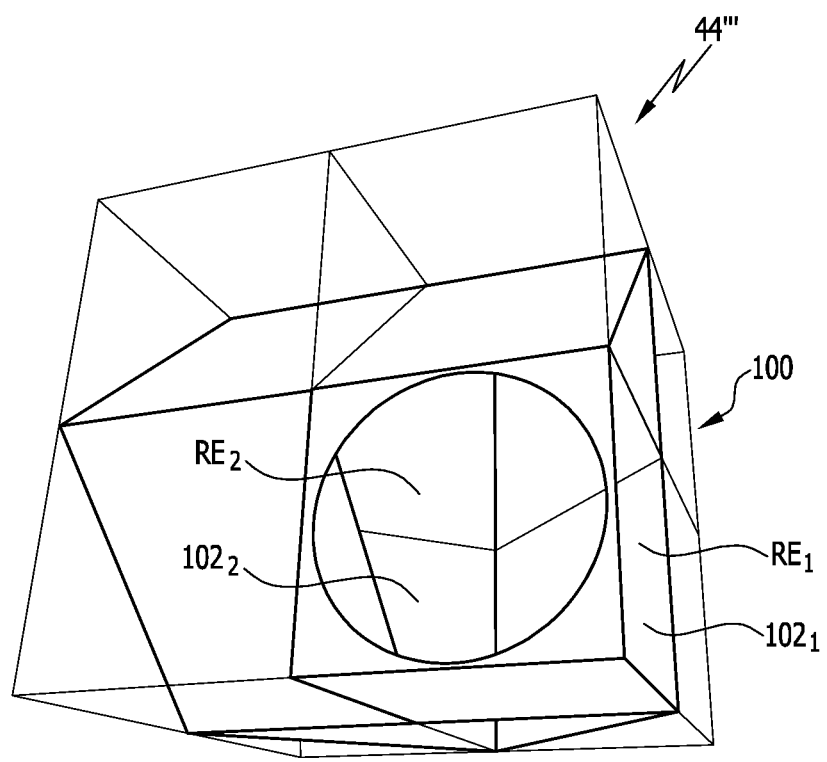
FIG. 6 shows a perspective illustration of a fourth exemplary embodiment of a converter according to the invention.
Figure 7:
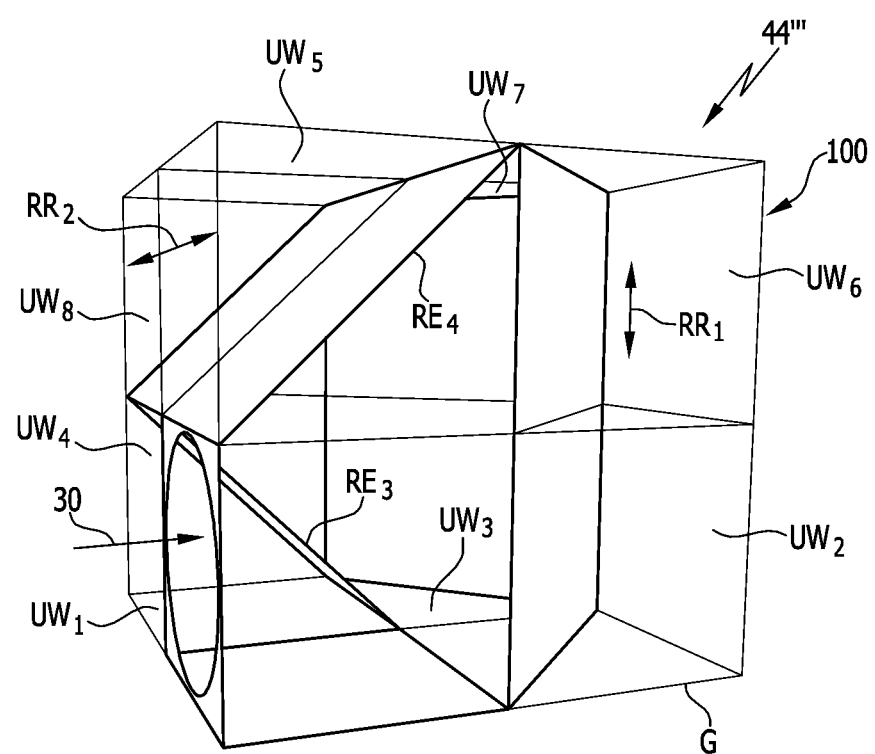
FIG. 7 shows an illustration of the fourth exemplary embodiment of the converter of the invention according to FIG. 6 from a different viewing direction.
Figure 8:
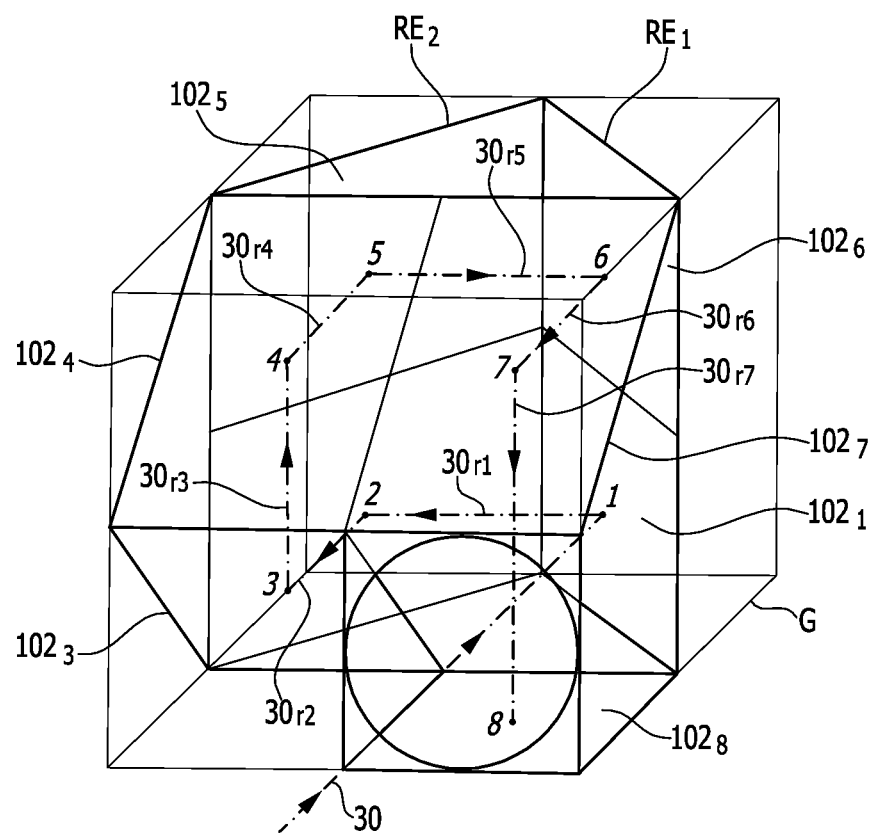
FIG. 8 shows an illustration of a radiation path in the fourth exemplary embodiment of a converter according to the invention.

A fourth exemplary embodiment of a converter 44''' according to the invention is illustrated in FIGS. 6 to 8.

The converter 44''' is formed by a spatial arrangement of reflective surfaces 102 in a converter element 100 which are arranged in a compact manner, for example in an outer geometry corresponding to a cube W, the cube being composed of eight sub-cubes UW and the reflective surfaces 102 being arranged corresponding to diagonal surfaces of the sub-cubes.

The eight sub-cubes $UW_1$ to $UW_8$ of the same size are arranged as follows.

A first sub-cube layer is formed on a base area G, the sub-cube layer comprising the sub-cubes $UW_1$, $UW_2$, $UW_3$ and $UW_4$, all of which are arranged adjoining one another in a counterclockwise sequence within the square outer geometry. Resting on top of this sub-cube layer composed of the sub-cubes $UW_1$ to $UW_4$ there is a second sub-cube layer composed of the sub-cubes $UW_5$ to $UW_8$, which likewise are arranged adjoining one another in a counterclockwise sequence within the square outer geometry, the sub-cube $UW_5$ resting on the sub-cube $UW_1$, the sub-cube $UW_6$ resting on the sub-cube $UW_4$, the sub-cube $UW_7$ resting on the sub-cube $UW_3$ and the sub-cube $UW_8$ resting on the sub-cube $UW_4$.

The sub-cubes $UW_2$ and $UW_6$ are provided with a reflection plane $RE_1$ which passes through the two sub-cubes $UW_2$ and $UW_6$, runs along the same diagonal of the two sub-cubes $UW_2$ and $UW_6$ and extends parallel to a first reflector direction $RR_1$.

Moreover, the sub-cubes $UW_3$ and $UW_7$ are provided with a reflection plane $RE_2$ which passes through the two sub-cubes $UW_3$ and $UW_7$, which likewise runs parallel to the first reflector direction $RR_1$ along the same diagonal of the two sub-cubes $UW_3$ and $UW_7$ and runs perpendicular to the reflection plane $RE_1$, the reflection planes $RE_1$ and $RE_2$ facing the sub-cubes $UW_1$ and $UW_2$ as well as $UW_5$ and $UW_6$.

Furthermore, the sub-cubes $UW_8$ and $UW_5$ are provided with a reflection plane $RE_3$ which runs along a common diagonal of these sub-cubes $UW_8$ and $UW_5$ parallel to a reflector direction $RR_2$, which, in turn, runs perpendicular to the reflector direction $RR_1$.

The sub-cube $UW_4$ is provided with a reflection plane $RE_3$ which runs parallel to the reflection direction $RR_2$ and parallel to a diagonal of the sub-cube $UW_4$ and perpendicular to the reflection plane $RE_4$, the reflection plane $RE_3$ facing the sub-cubes $UW_3$ and $UW_7$ and the reflection plane $RE_4$ facing the sub-cubes $UW_2$ and $UW_3$ as well as $UW_6$ and $UW_7$.

An incident energy-transmitting laser beam 30 extending centrally with its optical axis through the first sub-cube $UW_1$ passes the sub-cube $UW_1$ without reflection and impinges on the first reflective surface $102_1$, which lies in the reflection plane $RE_1$ in the sub-cube $UW_2$.

From this reflective surface $102_1$, the laser beam 30 is reflected in the form of the first reflective portion $30_{r1}$ onto the second reflective surface $102_2$ in the reflection plane $RE_2$, which lies in the sub-cube $UW_3$ and reflects the laser beam 30 in the form of the second reflected portion $30_{r2}$ onto the third reflective surface $102_3$ in the reflection plane $RE_3$ which lies in the sub-cube $UW_4$, wherein the reflection plane $RE_3$, in turn, reflects the laser beam 30 in the form of the third reflected portion $30_{r3}$ onto the fourth reflection surface $102_4$ that lies in the reflection plane $RE_4$, which plane $RE_4$, in turn, reflects the laser beam 30 in the form of the fourth reflected portion $30_{r4}$ onto the fifth reflective surface $102_5$, which lies in the reflection plane $RE_2$. From there, in turn, reflection of the laser beam 30 in the form of the fifth reflected portion $30_{r5}$ onto the reflective surface $102_6$, which lies in the reflection plane $RE_1$ in the sub-cube $UW_6$, takes place, and from the reflective surface $102_6$, reflection of the laser beam 30 in the form of the sixth reflected portion $30_{r6}$ onto the reflective surface $102_7$, which lies in the reflection plane $RE_4$ in the sub-cube $UW_5$, takes place. From the reflective surface $102_7$, reflection of the laser beam 30 in the form of the seventh reflected portion $30_{r7}$ onto an end surface $102_8$, which lies in the sub-cube $UW_1$ and coincides with the base area G, takes place.

All reflective surfaces $102_1$ to $102_8$ are formed by a conversion unit 80 as described in connection with FIG. 3.

In this exemplary embodiment as well, there is the possibility to vary the reflectivity from conversion unit 80 to conversion unit 80 so that, for example, the coating 74 is set in such a manner that an eighth of the energy of the incident energy-transmitting laser beam 30 is absorbed by the conversion unit 186 associated with the reflective surface $102_1$, while a seventh of the energy of the laser beam 30 is absorbed by the reflective unit 80 associated with the reflective surface $102_2$.

In general, the following series for the absorption in the conversion units 80 associated with the successive reflective surfaces 102 can be established in this context. The absorptance of the individual successive conversion units 80 results in the following series $1/n, 1/(n-1) \ldots, \frac{1}{2}, 1$ with n representing the number of conversion units 80 acted on by the energy-transmitting laser beam 30.

Figure 9:
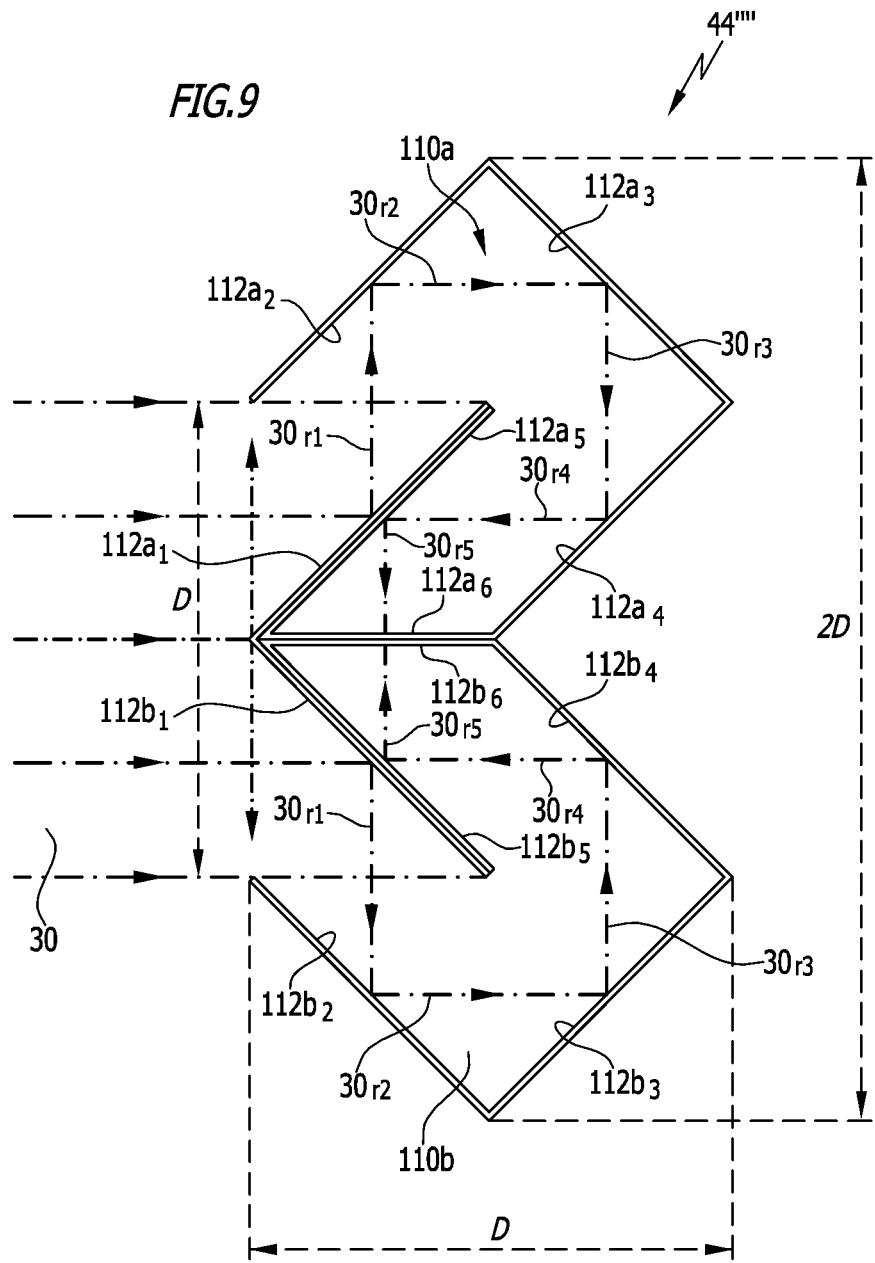
FIG. 9 shows a section through a fifth exemplary embodiment of a converter according to the invention.

In a fifth exemplary embodiment of a converter 44"" according to the invention, illustrated in FIG. 9, a division of the incident energy-transmitting laser beam 30 between two cells 110a and 110b takes place in a converter element 110, each of which cells has a first reflective surface $112a_1$ and $112b_1$ situated at an angle of 45° to a propagation direction of the incident energy-transmitting laser beam 30.

This first reflective surface $112a_1$ and $112b_1$ in each case reflects the incident portion $30_e$ of the energy-transmitting laser beam 30 onto a second reflective surface $112a_2$ or $112b_2$, respectively, which runs parallel to the first reflective surface $112a_1$ or $112b_1$, respectively, but is offset with respect to the first surface.

The second reflective surface $112a_2$ or $112b_2$ reflects the first reflected portion $30r_1$ of the laser beam 30 incident thereon as the second reflected portion $30r_2$ onto a third reflective surface $112a_3$ or $112b_3$, and this surface reflects the second reflected portion $30r_2$ incident onto it as a third reflected portion $30r_3$ onto a fourth reflective surface $112a_4$ or $112b_4$, which, in turn, is arranged parallel to the second reflective surface $112a_2$ or $112b_2$ and which reflects the third incident portion $30r_3$ as the fourth reflected portion $30r_4$ onto a fourth reflective surface $112a_5$ or $112b_5$, which is disposed on a rear side of the respective first reflective surface $112a_1$ or $112b_1$ and which reflects the fourth reflected portion $30r_4$ as portion $30_5$ onto the surface $112a_6$ or $112b_6$, which, in turn, either absorbs the fifth reflected portion $30_5$ completely or optionally also reflects it.

In this exemplary embodiment as well, each of the reflective surfaces 112 is formed by a conversion unit 80, the coating 74 of which reflects part of the energy of the laser beam 30 and allows part of the energy of the laser beam 30 to enter the photovoltaic element 70 to convert the optical energy directly into electrical energy.

In the fifth exemplary embodiment, all reflective surfaces $112a_1$ to $112a_5$ or $112b_1$ to $112b_5$ are preferably arranged at an angle of 45° to the propagation direction of the incident energy-transmitting laser beam 30, the reflective surfaces $112a_1$ and $112a_5$ as well as $112b_1$ and $112b_5$ adjoining one another back-to-back and being offset relative to the reflective surfaces $112a_2$ and $112a_4$ or $112b_2$ and $112b_4$, which run parallel to the reflective surfaces $112a_1$ and $112a_5$ or $112b_1$ and $112b_5$, in such a manner that the reflective surfaces $112a_2$ and $112b_2$ enable the incident energy-transmitting laser beam 30 to freely impinge with its entire beam diameter D on the reflective surfaces $112a_1$ and $112b_1$, but on the other hand, also reflect the reflected portion $30_{r1}$, reflected by the reflective surfaces $112a_1$ and $112b_1$, with full cross-section onto the reflective surface $112a_3$ or $112b_3$, which runs perpendicular to the reflective surfaces $112a_1$ and $112b_2$. The reflective surfaces $112a_3$ and $112b_3$, in turn, run perpendicular to the reflective surfaces $112a_4$ and $112b_4$ so that the latter, in turn, further reflect the reflected portion $30_3$ with full cross-section onto the reflective surfaces $112a_5$ or $112b_5$.

However, in a variant of the fifth exemplary embodiment according to FIG. 9 there is the possibility to omit the reflective surfaces $112a_6$ and $112b_6$, so that the reflected portion $30_{r5}$ can pass over from the cell 110a or 110b to the respective other cell 110b or 110a, and can pass through same in the opposite direction.

Figure 10:
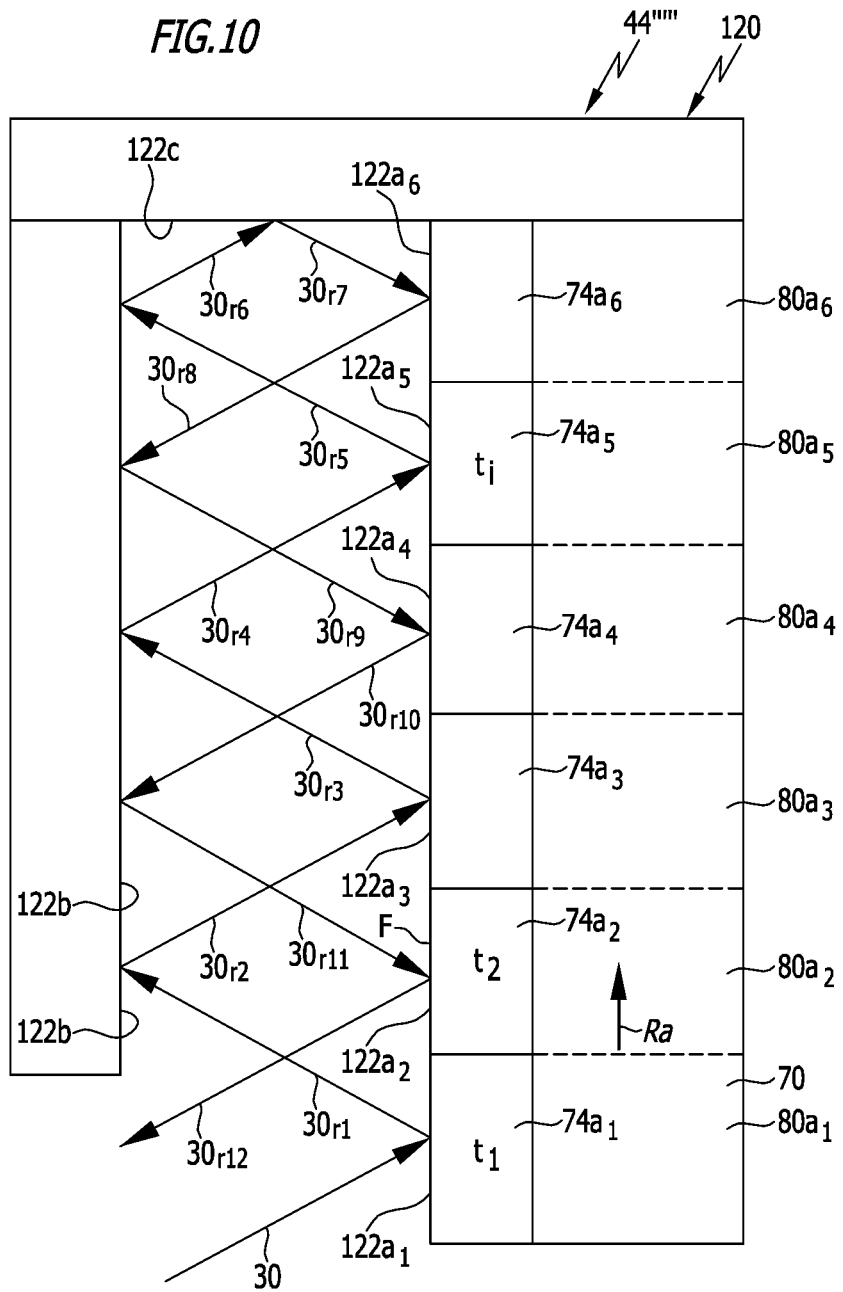
FIG. 10 shows a section through a sixth exemplary embodiment of a converter according to the invention.

In a sixth exemplary embodiment of a converter 44"" according to the invention, illustrated in FIG. 10, conversion units $80a_1$ to $80a_6$ are provided successively in a row direction $R_a$, which have reflective surfaces $122a_1$ to $122a_6$ lying in a common surface F, in particular in a common plane. Opposite these reflective surfaces $112a_1$ to $122a_6$ there is provided an essentially completely reflective surface 122b which faces the reflective surfaces $122a_1$ to $122a_6$ and is spaced apart therefrom and preferably runs parallel thereto, as well as a further reflective surface 122c which runs transverse, in particular perpendicular, to the reflective surfaces 122a and also the reflective surface 122b.

The reflective surfaces $122a_1$ to $122a_6$ are formed by partially reflective coatings $74_1$ to $74_6$ of the conversion units $80a_1$ to $80a_6$, the reflectance of which varies.

Each of the coatings $74_1$ to $74_6$ is disposed on a single photovoltaic element 70, each of the coatings $74_1$ to $74_6$ covering a subarea of the photovoltaic element and in each case forming a conversion unit $80_1$ to $80_6$ with this subarea.

Along with the variation of the reflectances of the reflective coatings $74_1$ to $74_6$, the absorptances of these conversion units $80_1$ to $80_6$ vary as well, the absorptances being adapted such that the subarea of the photovoltaic element 70 covered by the respective coating $74_1$ to $74_6$ absorbs approximately the same intensity of laser radiation as the remaining areas of the photovoltaic element 70.

In the sixth exemplary embodiment of the converter 44"" according to the invention, the incident energy-transmitting laser beam 30 initially impinges on the reflective surface $112a_1$ and is partially reflected by the latter, thereby forming the first reflected portion $30_{r1}$, which impinges on the reflective surface $122b$, while the non-reflected part of the intensity is absorbed in the conversion unit $80a_1$.

The reflective surface $122_b$ reflects the first reflected portion $30_{r1}$ essentially completely, so that a reflected portion $30_{r2}$ impinges on the reflective surface $122a_3$, and a part of the intensity is reflected by the latter while the non-reflected part of the intensity is absorbed by the conversion unit $80a_3$ carrying the reflective layer $74a_3$.

The third reflected portion $30_{r3}$, in turn, impinges on the reflective surface $122b$ and is reflected essentially completely by the latter so that a fourth reflected portion $30_{r4}$ impinges on the reflective surface $122a_5$, a part of the intensity being reflected and a part of the intensity being absorbed by the conversion unit $80a_5$.

The fifth reflected portion $30_{r5}$ impinges again on the reflective surface $122_b$, is reflected essentially completely by the latter as the sixth reflected portion $30_{r6}$, impinges on the reflective surface $122c$ and is reflected essentially completely by the latter as the seventh reflected portion $30_{r7}$ so that it impinges on the reflective surface $122a_6$. A part of the intensity is reflected by the latter and a part of the intensity is absorbed in the conversion unit $80a_6$.

The reflected portion $30_{r8}$ then impinges on the reflective surface $122_b$ and is reflected by the latter as reflected portion $30_{r9}$ and impinges on the reflective surface $122a_4$. A part of the intensity is reflected by the latter as reflected portion $30_{r10}$ and a part of the intensity is absorbed by the conversion unit $80_{a4}$. The reflected portion $30_{r10}$ impinges on the reflected surface $122b$ and is reflected by the latter as reflected portion $30_{r11}$ so that it impinges on the reflective surface $122_{a2}$, a part of the intensity being absorbed by the conversion unit $80_{a2}$ and a part being reflected as reflected portion $30_{r12}$, which, however, preferably has little or no intensity.

Due to the fact that each of the conversion units $80a_1$ to $80a_6$ comprises subareas of a photovoltaic element, this exemplary embodiment of the converter according to the invention can be produced in a particularly simple and cost-effective manner.

Figure 11:
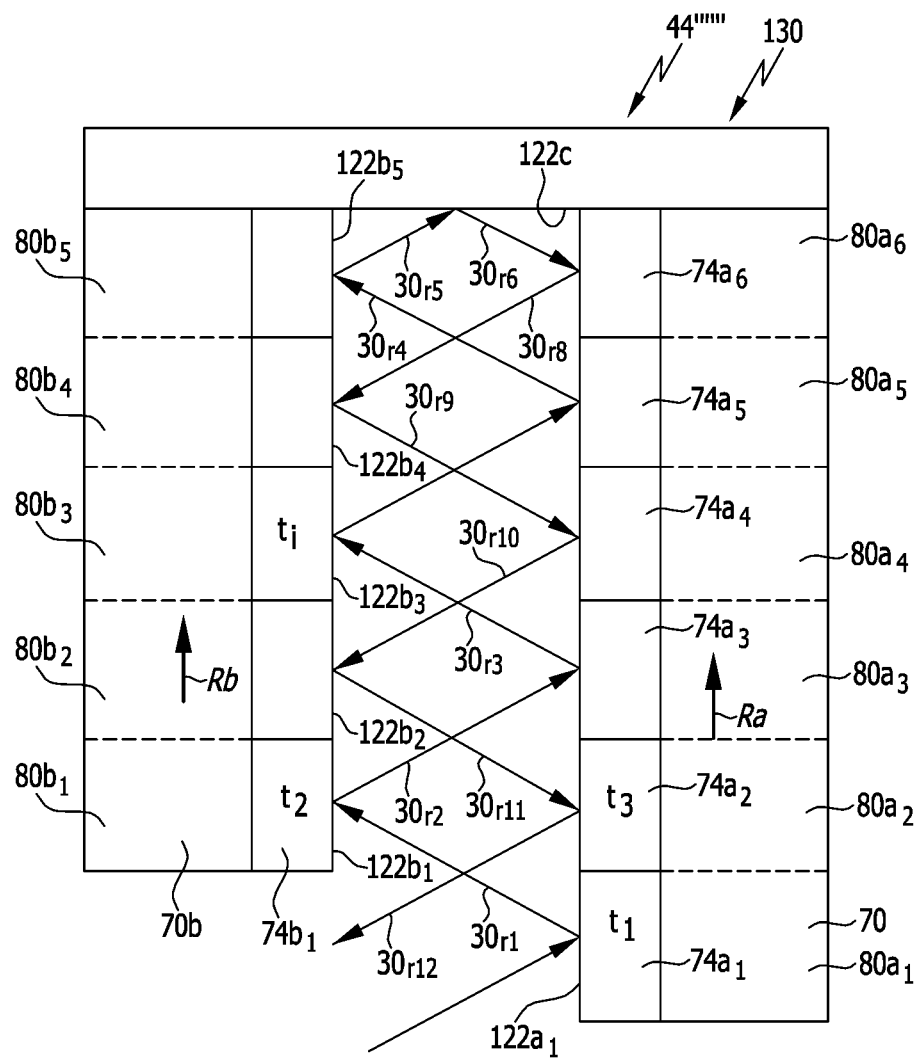
FIG. 11 shows a section through a seventh exemplary embodiment of a converter according to the invention.

In a seventh exemplary embodiment of a converter $44''''$ according to the invention, illustrated in FIG. 11, the arrangement and the functionality of the reflective surfaces $122a_1$ to $122a_6$, the coatings $74a_1$ to $74a_6$, and the conversion units $80a_1$ to $80a_6$ are identical to those of the sixth exemplary embodiment.

However, in contrast to the sixth exemplary embodiment, the reflective surface $122b$ in the seventh exemplary embodiment is not a completely reflective surface, but is likewise divided into reflective surfaces $122b_1$ to $122b_5$, each of which is partially reflective and partially permits absorption of the intensity in the respective conversion unit $80b_1$ to $80b_5$ arranged in a row direction $R_b$ that is parallel to the row direction $R_a$, the conversion units $80b_1$ to $80b_5$ being formed by subareas of the photovoltaic element $70b$ and additionally comprising the coatings $70b_1$ to $70b_5$, which form the reflective surfaces $122b_1$ to $122b_5$.

Thus, the reflective portions $30_{r3}$, $30_{r4}$, $30_{r8}$ and $30_{r10}$ are not reflected completely, but, rather, are reflected only partially by the individual reflective surfaces $122b_1$ to $122b_6$, so that a corresponding absorption of intensity still takes place in the conversion units $80b_1$ to $80b_5$.

The advantage of the seventh exemplary embodiment therefore lies in the fact that the number of conversion units 80 is increased, and setting the absorptances and reflectances of the individual coatings $70a$ and $70b$ therefore can be carried out in an even simpler manner to adapt the intensity absorbed by the respective conversion units $80a$ and $80b$ in such a manner that approximately the same intensity is absorbed in each conversion unit.

In a refinement of the seventh exemplary embodiment, there is also the possibility to provide no individual, separate coatings $74a_1$ to $74a_6$ or $74b_1$ to $74b_5$, but instead to continuously vary the reflectance and absorptance of the individual coatings $70a$ and $74b$ in the row direction $R_a$ and $R_b$, respectively.

What is claimed is:

1. An optical energy transmission system, comprising:
an energy-emitting unit, which comprises:
   a laser radiation source for generating an energy-transmitting laser beam, and
   an aiming device for aligning the energy-transmitting laser beam, and
an energy-receiving unit which comprises an optical/electrical converter that converts energy of the energy transmitting laser beam directly into electrical energy,
wherein:
the aiming device aligns the energy-transmitting laser beam relative to the energy-receiving unit,
the optical/electrical converter comprises at least one converter element having a plurality of reflective surfaces which reflect the energy-transmitting laser beam impinging on said converter element,
the plurality of reflective surfaces are arranged relative to one another such that the impinging energy-transmitting laser beam is reflected by one of the reflective surfaces to another one of the reflective surfaces, and at least some of the reflective surfaces are formed in each case by a conversion unit which reflects one part of the impinging energy-transmitting laser beam and absorbs the other part thereof in a photovoltaic element which is comprised by the conversion unit, and in the process converts the optical energy directly into electrical energy,
the conversion units each comprise the photovoltaic element and a reflection-determining coating disposed on a radiation entrance surface of the photovoltaic element,
the impinging energy-transmitting laser beam is reflected from at least one of the conversion units to at least one other of the conversion units, and
of the conversion units which are successively acted on by the impinging energy-transmitting laser beam, the reflectance decreases and the absorptance increases in the order in which the conversion units are acted on by the impinging energy-transmitting laser beam.

2. The energy-transmitting system according to claim 1, wherein the optical/electrical converter is formed such that the energy-transmitting laser beam first impinges on a first reflective surface of the plurality of reflective surfaces at an incident angle that is 80° or less.

3. The energy-transmitting system according to claim 1, wherein all the conversion units of the optical/electrical converter have the same reflectance and absorptance.

4. The energy-transmitting system according to claim 1, wherein:
the conversion units successively acted on by the impinging energy-transmitting laser beam have different reflectances and absorptances.

5. The energy-transmitting system according to claim 1, wherein the reflective surfaces reflect the impinging energy-transmitting laser beam in such a manner that the impinging energy-transmitting laser beam extends overall in two spatial directions in the converter element.

6. The energy-transmitting system according to claim 1, wherein the reflective surfaces reflect the impinging energy-transmitting laser beam in such a manner that the impinging energy-transmitting laser beam extends overall in three spatial directions in the converter element.

7. The energy-transmitting system according to claim 1, wherein the reflective surfaces of the converter element run at an angle in a range between 40° and 50° to the respective portion of the impinging energy-transmitting laser beam impinging on these reflective surfaces.

8. The energy-transmitting system according to claim 1, wherein the converter element is constructed such that after reflection of the impinging energy-transmitting laser beam at the plurality of reflective surfaces, the converter element reflects the impinging energy-transmitting laser beam back on itself.

9. The energy-transmitting system according to claim 8, wherein the converter element comprises a triple prism that reflects the impinging energy-transmitting laser beam back on itself.

10. The energy-transmitting system according to claim 1, wherein after reflection of the impinging energy-transmitting laser beam at a plurality of the reflective surfaces, the converter element absorbs the impinging energy-transmitting laser beam substantially completely by a last conversion unit of the respective conversion units.

11. The energy-transmitting system according to claim 1, wherein the aiming device comprises an aiming control which controls alignment of the energy-transmitting laser beam relative to the energy-receiving unit.

12. The energy-transmitting system according to claim 1, wherein the aiming device comprises a target detection unit which detects a position of an impingement area of the energy-receiving unit, which impingement area is provided for the energy-transmitting laser beam.

13. The energy-transmitting system according to claim 12, wherein the target detection unit detects the position of the impingement area within a spatial detection range.

14. The energy-transmitting system according to claim 1, wherein the aiming device detects impingement of the energy-transmitting laser beam on an impingement area of the energy-receiving unit, and prevents the energy-transmitting laser beam from exiting the energy-emitting unit if the energy-transmitting laser beam does not impinge on the impingement area.

\* \* \* \* \*